(12) United States Patent  
Yun (10) Patent No.: US 8,450,679 B2
(45) Date of Patent: May 28, 2013

(54) SENSING DEVICE USING PROXIMITY SENSOR AND MOBILE TERMINAL HAVING THE SAME

(75) Inventor: Sang Won Yun, Metropolitan (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 718 days.

(21) Appl. No.: 12/655,653

(22) Filed: Jan. 5, 2010

(65) Prior Publication Data

US 2010/0171027 A1    Jul. 8, 2010

(30) Foreign Application Priority Data

Jan. 5, 2009    (KR) .................. 10-2009-0000313

(51) Int. Cl.
*H01J 40/14* (2006.01)
*G06M 7/00* (2006.01)
*H04N 7/18* (2006.01)

(52) U.S. Cl.
USPC ........................ 250/239; 250/221; 348/154

(58) Field of Classification Search
USPC .... 250/208.1, 216, 221, 222.1, 239; 358/406, 358/437, 488, 496, 504, 505, 506; 345/32–34, 345/176, 206, 207; 359/19, 247, 302, 317–319, 359/648; 348/94, 154, 155
See application file for complete search history.

(56) References Cited

U.S. PATENT DOCUMENTS

| 4,051,365 A | * | 9/1977 | Fukuyama et al. ........ 250/222.1 |
| 6,545,704 B1 | * | 4/2003 | Olsson et al. ................. 348/84 |
| 2008/0165116 A1 | | 7/2008 | Herz et al. |

FOREIGN PATENT DOCUMENTS

| JP | 62-119983 | 6/1987 |
| JP | 02-288121 | 11/1990 |
| JP | 11-144577 | 5/1999 |
| JP | 2000-331577 | 11/2000 |
| JP | 2004-119387 | 4/2004 |
| JP | 2007-052928 | 3/2007 |

OTHER PUBLICATIONS

European Search Report dated Mar. 31, 2010 in connection with European Patent Application No. 09180282.7.

* cited by examiner

*Primary Examiner* — Georgia Y Epps
*Assistant Examiner* — Don Williams (57) ABSTRACT

A mobile terminal includes a sensing device that uses a proximity sensor. The sensing device includes: a proximity sensor sensing approach of an external object; and a lens unit installed on top of the proximity sensor. The lens unit includes: a lens body having a first through-opening through which light emitted from a light emitting unit of the proximity sensor passes and a second through-opening through which light, reflected from the external object and entering into a light receiving unit of the proximity sensor, passes; and a reflective film formed in the lens body to surround edges of the first through-opening and the second through-opening. The lens body and the reflective film are integrated with each other by double injection molding. The lens body and the reflecting film are manufactured in a single body by double injection molding.

20 Claims, 6 Drawing Sheets

SENSING DEVICE USING PROXIMITY SENSOR AND MOBILE TERMINAL HAVING THE SAME

CROSS-REFERENCE TO RELATED APPLICATION(S) AND CLAIM OF PRIORITY

The present application is related to and claims priority to an application entitled "SENSING DEVICE USING PROXIMITY SENSOR AND MOBILE TERMINAL HAVING THE SAME" filed in the Korean Intellectual Property Office on Jan. 5, 2009 and assigned Serial No. 10-2009-0000313, the contents of which are incorporated herein by reference.

TECHNICAL FIELD OF THE INVENTION

The present invention relates generally to a sensing device using a proximity sensor and a mobile terminal having the same and, more particularly, to a sensing device using a proximity sensor in which malfunction of the proximity sensor is prevented and a mobile terminal having the same.

BACKGROUND OF THE INVENTION

Generally, a mobile terminal is an electronic device that allows a user to perform wireless communication, access a network, receive a digital broadcast, and so forth, regardless of time and place. Recently, mobile terminals have been developed to perform functions such as communication, Internet access, digital broadcast reception, and document creation, gaming, and the like.

Mobile terminals are gradually miniaturized and thinned to meet the needs of customers. Complying with this trend, interest in novel input devices is increasing to reduce a large volume of existing push-button input devices. Particularly, a new input method using a touch screen, remarkably different from the existing input method, attracts user attention.

Generally, a touch screen is one of the input devices that provide an interface between an information communication device using a display unit and a user. When the user directly touches a screen with an input device, such as a finger, a pen, or some other input device, the interface between the information communication device using a display unit and the user is activated. Because anyone can easily use the touch screen simply by touching the display unit with input tools, such as a finger, pen, and the like, the touch screen is applied to various devices such as an automated teller machine (ATM), a personal digital assistant (PDA), a mobile phone, and so on and in various sites such as banks, government and public offices, tour and traffic guides, and so forth.

There are various types of touch screens such as resistive, capacitive, ultraonic, infrared, and surface acoustic. Among the touch screens, the resistive type touch screen, which is cheap and to which various input tools such as a finger, a pen, and the like may be applied, is mainly used.

In the mobile terminal including the touch screen, when the user puts the mobile terminal to his/her ear to talk, the ear or cheek of the user presses the touch screen of the mobile terminal so that the touch screen may often malfunction. Therefore, a proximity sensor senses approach of the ear or cheek to the touch screen to prevent malfunction of the touch screen.

Commonly, the upper part of the proximity sensor is covered with a plane lens or a glass sheet. Because the plane lens and the glass sheet are made of transparent materials, light emitted from the proximity sensor is diffusively reflected from the surface or the inside of the plane lens and the glass sheet so that the proximity sensor malfunctions and erroneously senses the diffused reflection as the ear or cheek of the user approaching the touch screen. To solve this problem, power of the light emitting unit of the proximity sensor has to be reduced, but distance of sensing an external object is also shortened due to the reduced power.

Therefore, there is a need for a sensing device using a proximity sensor that senses an approaching external object in which malfunction of the proximity sensor is prevented and a mobile terminal having the same.

SUMMARY OF THE INVENTION

To address the above-discussed deficiencies of the prior art, it is a primary object to provide a sensing device using a proximity sensor that senses an approaching external object in which malfunction of the proximity sensor is prevented and a mobile terminal having the same.

In accordance with the above aspects of the present invention, there is provided a sensing device using a proximity sensor including: a proximity sensor configured to sense an approach of an external object; and a lens unit installed on top of the proximity sensor and including: a lens body including a first through-opening through which light emitted from a light emitting unit of the proximity sensor passes and a second through-opening through which light, reflected from the external object and entering into a light receiving unit of the proximity sensor, passes; and a reflective film formed in the lens body to surround edges of the first through-opening and the second through-opening, wherein the lens body and the reflective film are integrated with each other by double injection molding.

The present invention also provides a mobile terminal including: a sensing device, installed adjacent to a display unit provided in the front side of the mobile terminal and configured to control an operation of the display unit according to whether an external object approaches, the sensing device including: a proximity sensor configured to sense an approach of the external object using light reflected from the external device; and a lens unit installed at the top of the proximity sensor and including: a lens body made of transparent materials and including a first through-opening through which light emitted from a light emitting unit of the proximity sensor passes and a second through-opening through which light reflected from the external object and entering into a light receiving unit of the proximity sensor passes, and a reflective film made of opaque materials and formed in the lens body to surround edges of the first through-opening and the second through-opening, and wherein the lens body and the reflective film are integrated with each other by double injection molding.

Other exemplary embodiments of the present invention are included in the following detailed description and the accompanying drawings.

According to the sensing device using a proximity sensor and the mobile terminal including the same in accordance with an exemplary embodiment of the present invention, the opaque reflective film is formed in the transparent lens body of the lens unit installed on the proximity sensor so that malfunction of the proximity sensor may be prevented and accurate sensing of the proximity sensor for the approach of the external object may be increased.

Moreover, the lens body and the reflective film of the lens unit are integrally formed with each other by double injection molding so that the sensing device using the proximity sensor may be simplified and manufacturing costs may be reduced.

Moreover, since the light emitting unit of the proximity sensor emits light with maximum power, the sensing distance of the proximity sensor may be increased and power consumption required to operate the proximity sensor may be decreased when the object approaches at the same distance from the proximity sensor.

The through-opening covers are installed on the tops or the bottoms of the through-openings of the lens body respectively so that the inside of the mobile terminal may be prevented from being exposed to the outside.

The technical aspects of the present invention are not limited to the above-mentioned aspects and will be more apparent to those skilled from the following description.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 6B, discussed below, and the various embodiments used to describe the principles of the present disclosure in this patent document are by way of illustration only and should not be construed in any way to limit the scope of the disclosure.

Those skilled in the art will understand that the principles of the present disclosure may be implemented in any suitably arranged system.

In the same manner, some elements are exaggerated, omitted, and/or schematically depicted in the drawings. Moreover, sizes of respective elements are different from actual sizes thereof. The same reference symbols are used throughout the drawings to refer to the same or like parts.

Hereinafter, a sensing device using a proximity sensor and a mobile terminal including the same according to exemplary embodiments of the present invention will be described with reference to the accompanying drawings.

For the purpose of description, a mobile communication terminal is described as an example of a mobile terminal of the present invention, however the present invention is not limited to a mobile communication terminal. It will be appreciated that the mobile terminal of the present invention is a terminal including a sensing device using a proximity sensor and may be applied to information communication devices and multimedia devices such as a mobile communication terminal, a mobile telephone, a personal digital assistant (PDA), a smart phone, an international mobile telecommunication 2000 (IMT-2000), a code division multiple access (CDMA) terminal, a wideband code division multiple access (WCDMA) terminal, a global system for mobile communication (GSM) terminal, a general packet radio service (GPRS) terminal, an enhanced data GSM environment (EDGE) terminal, a universal mobile telecommunication service (UMTS) terminal, a digital broadcasting terminal, and an automated teller machine (ATM), and applications thereof.

Figure 1:
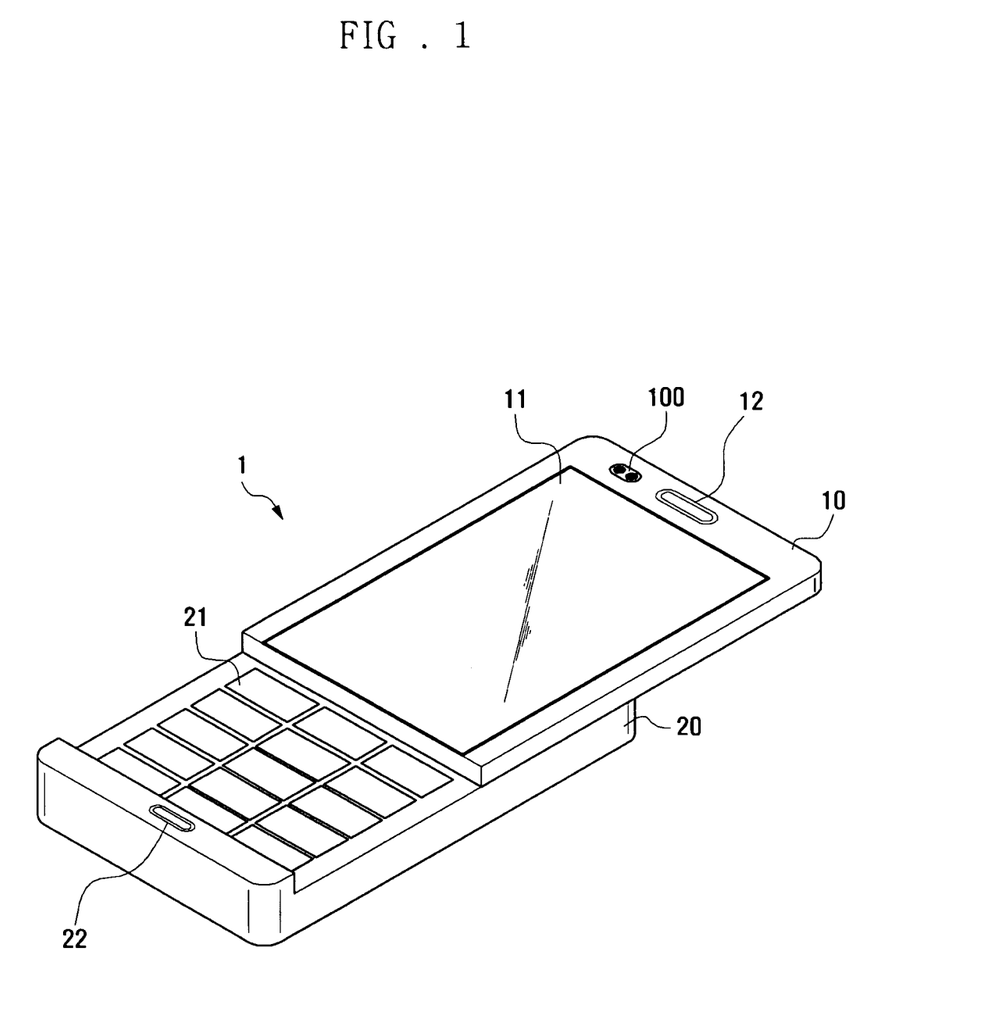
FIG. 1 illustrates a slide type mobile terminal.

FIG. 1 illustrates an existing slide type mobile terminal.

As illustrated in FIG. 1, an existing slide type mobile terminal 1 includes an upper case 10 that includes a display unit 11 provided on the front surface thereof and a lower case 20 that includes a key input unit 21. The upper case 10 may slide up and down on the lower case 20. The upper case 10 or the lower case 20 can include a sliding unit (not shown) guiding the sliding of the upper case 10. Meanwhile, in the following exemplary embodiments, the present invention is applied to the slide type mobile terminal, but the present invention is not limited thereto and may be a rotating type mobile terminal or a combination type (of the slide type and the rotating type) mobile terminal.

The display unit 11 serves as a user interface outputting a desired screen to a user or receiving a command from the user. The display unit 11 can use a liquid crystal display (LCD), organic light emitting diodes (OLED), thin film transistor (TFT), electrophoretic, laser induced thermal image (LITI), and the like.

LCD is an electric device for converting variable electric information generated from various devices into visual information using the change of transmittance of liquid crystal caused by applied voltage and for transferring the converted information. An OLED is a device emitting light using an electroluminescence phenomenon in which a fluorescent organic compound emits light in response to an electric current passed there through.

As illustrated in FIG. 1, the key input unit 21 is provided on the upper side of the lower case 20 to receive manipulation commands from the user. When the upper case 10 slides, the lower case 20 may be exposed. In FIG. 1, the entire upper side of the upper case 10 is occupied by the display unit 11, but a supplementary key input unit (not shown) receiving manipulation commands from the user may be provided at the lower side or the lateral sides of the upper case 10. The spare key input unit can include at least function keys for receiving commands from the user when the upper case 10 is coupled with the lower case 20.

As illustrated in FIG. 1, the mobile terminal 1 includes a receiver 12 provided at the upper end of the upper case 10 to output a voice signal and a transmitter 22 provided at the lower end of the lower case 20 to allow the user to input a voice signal. The user may listen to the voice signal from a counterpart while holding the receiver 12 against an ear and may transmit a voice signal to the counterpart while placing the transmitter 22 next to his/her mouth and speaking.

A sensing device 100 can be provided adjacent to the receiver 12. The sensing device 100 senses an approach of an external object to allow and interrupt a command key to be input through the display unit 11. For example, when the user puts the mobile terminal 1 to his/her ear so as to talk, the ear or cheek of the user presses the touch screen of the mobile terminal 1 so that the pressing of the touch screen is recognized as a user command and malfunction may occur. Therefore, in this case, the sensing device 100 senses the ear touching the touch screen and interrupts the input through the display unit 11 so that malfunction of the touch screen may be prevented. Details of the sensing device 100 will be described with reference to FIGS. 2 to 6 as below.

As illustrated in FIG. 1, the sensing device according to the exemplary embodiment of the present invention may be applied to the slide type mobile terminal 1 including the touch screen display unit 11 provided on the upper side of an upper case 10. Herein, the mobile terminal 1 may be one of various portable electronic devices such as a mobile phone, a personal digital assistant (PDA), a portable multimedia player (PMP), a navigator, a digital broadcasting receiver, and so forth.

Figure 2:
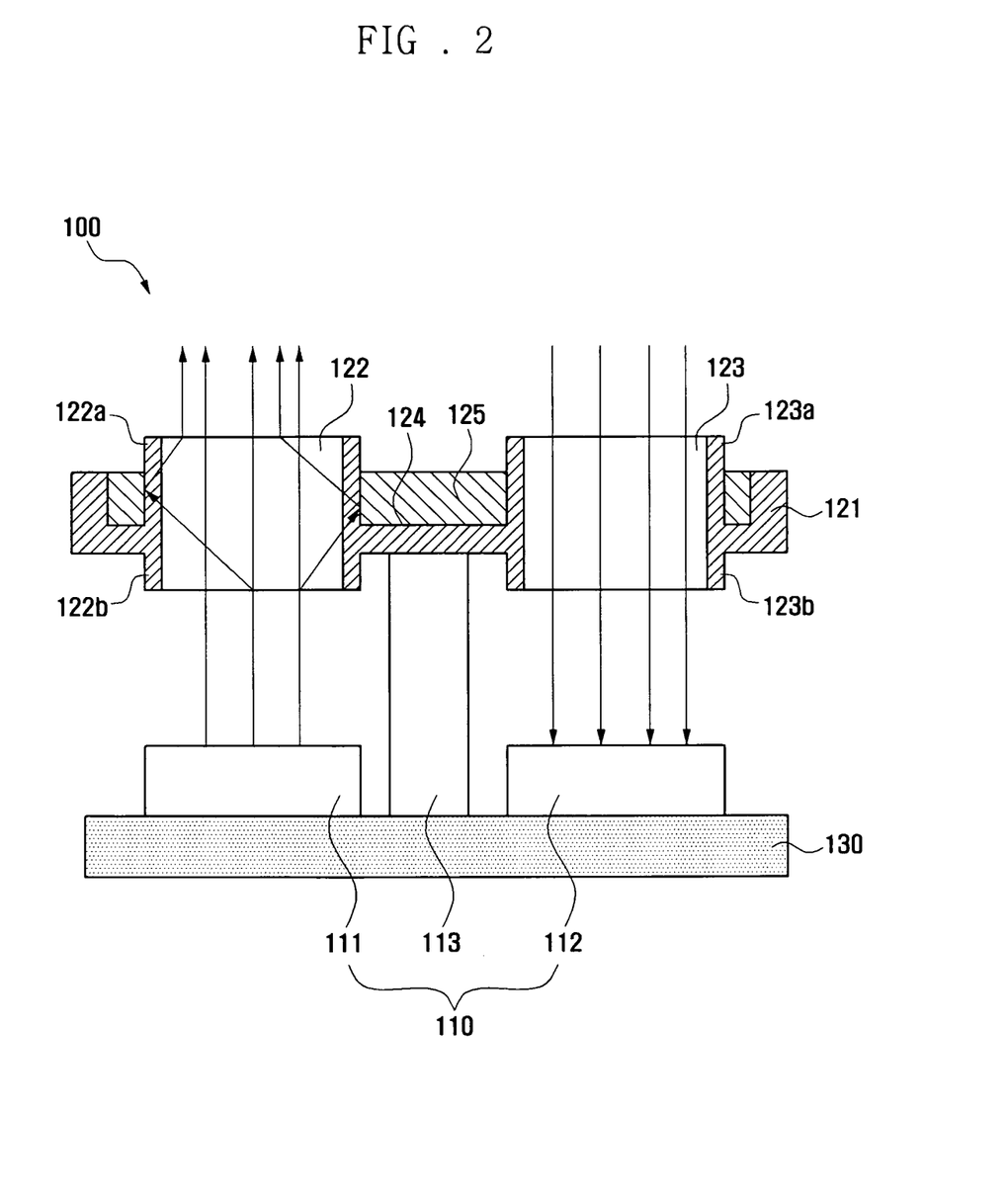
FIG. 2 illustrates a sensing device using a proximity sensor according to an exemplary embodiment of the present invention.

FIG. 2 illustrates a sensing device using a proximity sensor according to an exemplary embodiment of the present invention.

As illustrated in FIG. 2, the sensing device 100 includes a proximity sensor 110 that senses an approach of an external object and a lens unit 120 installed on the top of the proximity sensor 110. The sensing device 100 is installed adjacent to the upper end of the mobile terminal 1, for example the receiver 12.

The proximity sensor 110 can include a light emitting unit 111, a light receiving unit 112, and a light shielding film 113 and can be installed on an electric circuit board 130 mounted in the mobile terminal 1. The proximity sensor 110 senses the approach of the external object to allow or prevent a user command from being input through the display unit 11.

The light emitting unit 111 can emit light to measure a distance to any external object and the light receiving unit 112 can receive light reflected from the external object. The light shielding film 113 is installed between the light emitting unit 111 and the light receiving unit 112 and prevents light emitted from the light emitting unit 111 from directly entering the light receiving unit 112 so that malfunction of the proximity sensor 110 can be prevented. Preferably, an infrared (IR) sensor, which senses approach of an external object to a preset distance inside a sensing area using infrared light, can be used as the proximity sensor 110.

In this case, the light emitting unit 111 of the proximity sensor 110 can be a light emitting diode (LED) to emit the infrared (IR) light.

In the proximity sensor as illustrated in FIG. 2, the light emitting unit 111 and the light receiving unit 112 are physically separated from each other and the shield 113 is interposed there between. However, the configuration of the proximity sensor 110 is not limited thereto but may be changed and modified by those skilled in the art. For example, a proximity sensor 110, in which the light emitting unit 111 and the light receiving unit 112 of the proximity sensor 110 are coupled with each other, can be used.

The lens unit 120 can be installed on the proximity sensor 110. The lens unit 120 can allow the light emitted from the light emitting unit 111 and the light reflected from the external object entering the light receiving unit 112 to pass there through. The lens unit 120 prevents the proximity sensor 110, that is, the inside of the mobile terminal 1, from being exposed to the outside.

Hereinafter, the lens unit 120 will be described in detail with reference to FIGS. 3A to 6B.

Figure 3A:
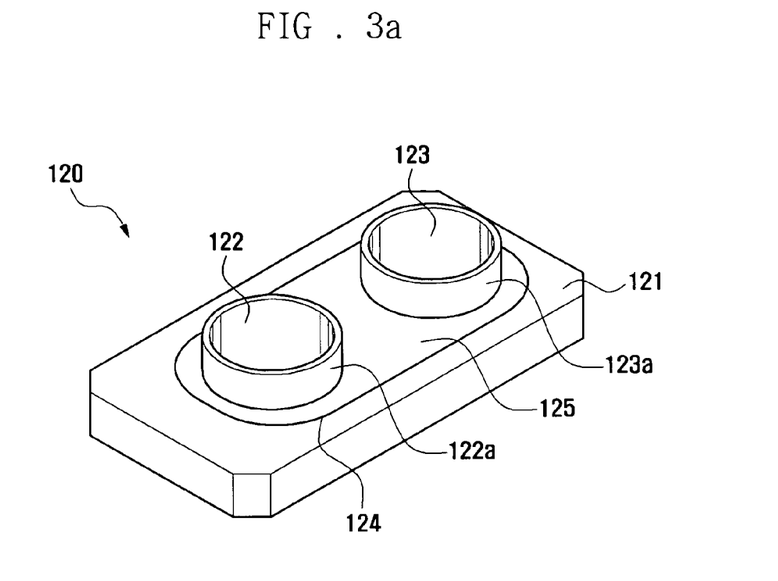
FIGS. 3A and 3B illustrate a lens unit of a sensing device using a proximity sensor according to an exemplary embodiment of the present invention.
Figure 3B:
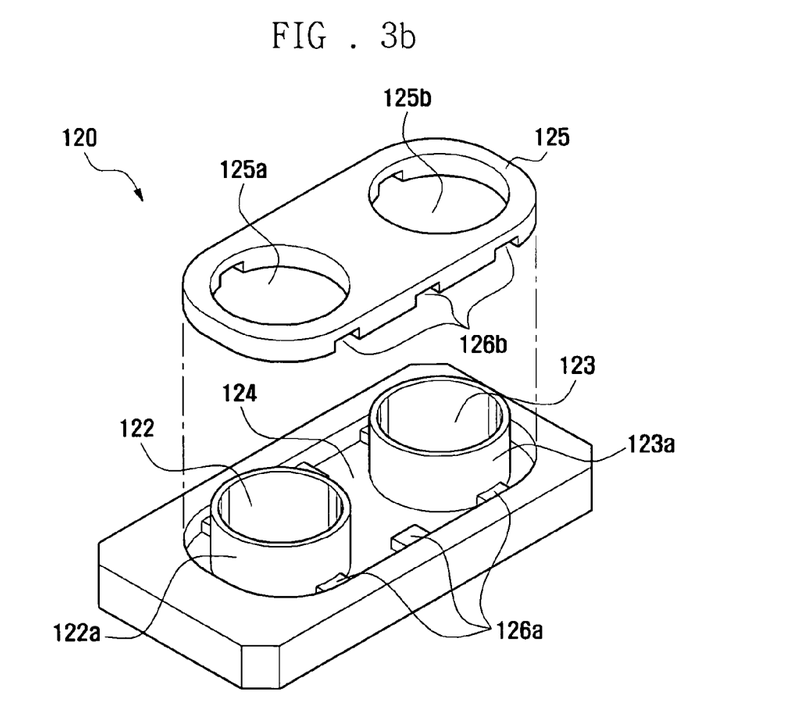

FIGS. 3A and 3B are a perspective view and an exploded perspective view respectively illustrating a lens unit of a sensing device using a proximity sensor according to an exemplary embodiment of the present invention.

As illustrated in FIG. 3A, the lens unit 120 can include a lens body 121 including a first through-opening 122 and a second through-opening 123 and a reflective film 125 formed in the lens body 121. The lens body 121 and the reflective film 125 are coupled with each other into a body, but for convenience of description, the lens body 121 and the reflective film 125 forming the lens unit 120 are illustrated as being separated from each other in FIG. 3B.

The lens body 121 can have an approximately thin plate-shape. Preferably, the lens body 121 can be made of transparent materials such as transparent glass, transparent plastic, and the like. Therefore, the transmittance of light emitted from the light emitting unit 111 of the proximity sensor 110 and light reflected from an external object and entering into the light receiving unit 112 can be increased.

Figure 4A:
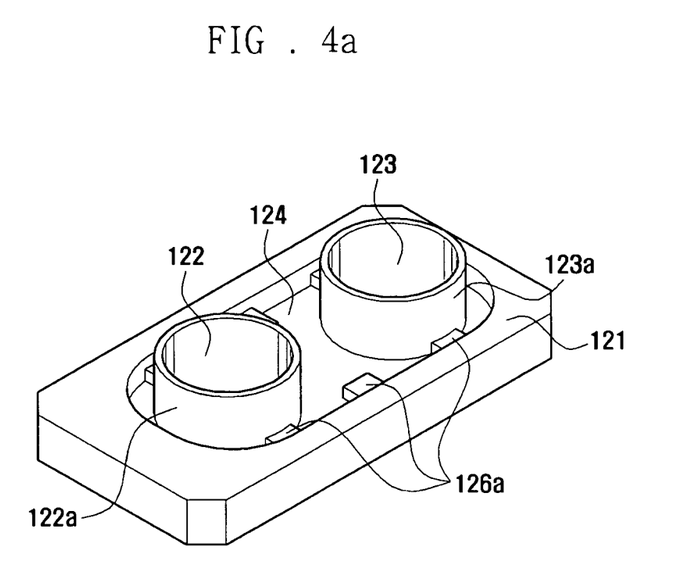
FIGS. 4A and 4B illustrate a lens body forming a lens unit of a sensing device using a proximity sensor according to an exemplary embodiment of the present invention.
Figure 4B:
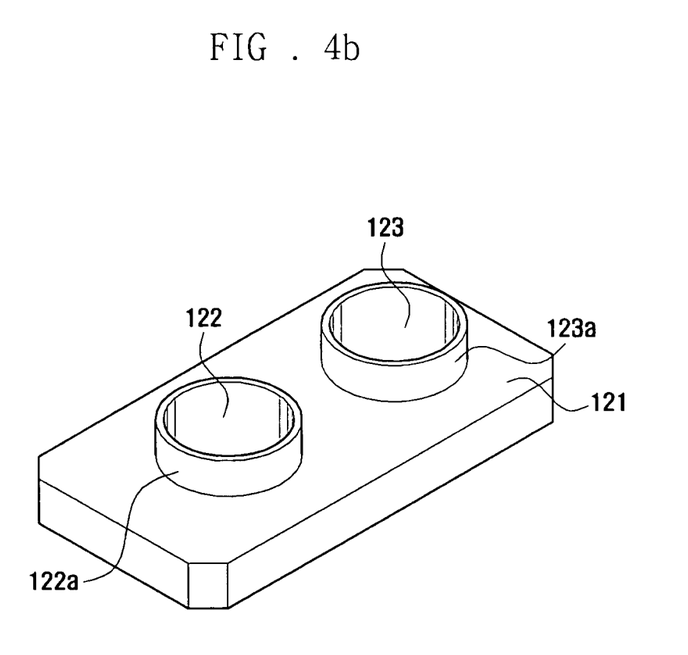

FIGS. 4A and 4B illustrate a lens body forming a lens unit of a sensing device using a proximity sensor according to an exemplary embodiment of the present invention.

The first through-opening 122 through which light emitted from the light emitting unit 111 passes and the second through-opening 123 through which light reflected from the external object and entering into the light receiving unit 112 of the proximity sensor 110 passes can be formed in the lens body 121. Preferably, the first through-opening 122 and the second through-opening 123 have an approximately cylindrical hole shape such that light emitted from the light emitting unit 111 and light entering into the light receiving unit 112 may easily pass there through.

According to the exemplary embodiment of the present invention, the first through-opening 122 is formed at a part through which light emitted from the light emitting unit 111 of the proximity sensor 110 passes and the second through-opening 123 is formed at a part through which light enters into the light receiving unit 112 of the proximity sensor 110. However, the present invention is not limited thereto. That is, when the through-openings 122 and 123 are formed on optical paths of light emitted from the light emitting unit 111 of the proximity sensor 110 and light entering into the light receiving unit 112 of the proximity sensor 110, the number and shape of the through-openings can be changed and modified by those skilled in the art.

As illustrated in FIGS. 4A and 4B, the lens body 121 includes first protrusions 122a and 122b and second protrusions 123a and 123b extended upward and downward from the edges of the first through-opening 122 and the second through-opening 123. Since the first and second through-openings 122 and 123 have a cylindrical hole-shape, the first and second protrusions 122a, 122b, 123a and 123b can have an approximately cylindrical shape. The lens body 121 may increase the transmittance of light emitted from the light emitting unit 111 of the proximity sensor 110 and light received by the light receiving unit 112 of the proximity sensor 110 due to the first and second protrusions 122a, 122b, 123a, and 123b. FIGS. 4A and 4B illustrate the first and second protrusions 122a, 122b, 123a, and 123b protruded upwardly and downwardly from the edges of the first and second through-openings 122 and 123, however the first and second protrusions 122a, 122b, 123a, and 123b may protrude in one direction of the upward and downward directions.

Meanwhile, the lens body 121 can include a groove 124 mated with the shape of the reflective film 125 such that the reflective film 125 can be inserted into the groove 124. The groove 124 can have the same depth as the thickness of the reflective film 125 so that the upper surface of the reflective film 125 is aligned with the upper surface of the lens body 121 when the reflective film 125 is inserted into the lens body 121. Additionally, thickness of the reflective film 125 may be slightly smaller than the thickness of the lens body 121.

FIG. 4A illustrates the groove 124 formed in the lens body 121, but the present invention is not limited thereto. For example, the lens body 121 can have a through-hole unit (not shown) matching the shape of the reflective film 125 and penetrating through the lens body 121 such that the reflective film 125 may be inserted into the through-hole unit.

The reflective film 125 is provided in the lens body 121 to surround the edges of the first through-opening 122 and the second through-opening 123. Preferably, the reflective film 125 may be made of opaque materials such as various kinds of opaque resins. Therefore, light emitted from the light emitting unit 111 of the proximity sensor 110 and light entering into the light receiving unit 112 of the proximity sensor 110 may be reflected from the reflective film 125 and transmitted only through the first and second through-openings 122 and 123. Since the reflectance of light by the reflective film 125 increase when color of the reflective film 125 is bright (for example, white color), a sensing distance of the proximity sensor 110 can be increased.

Figure 5A:
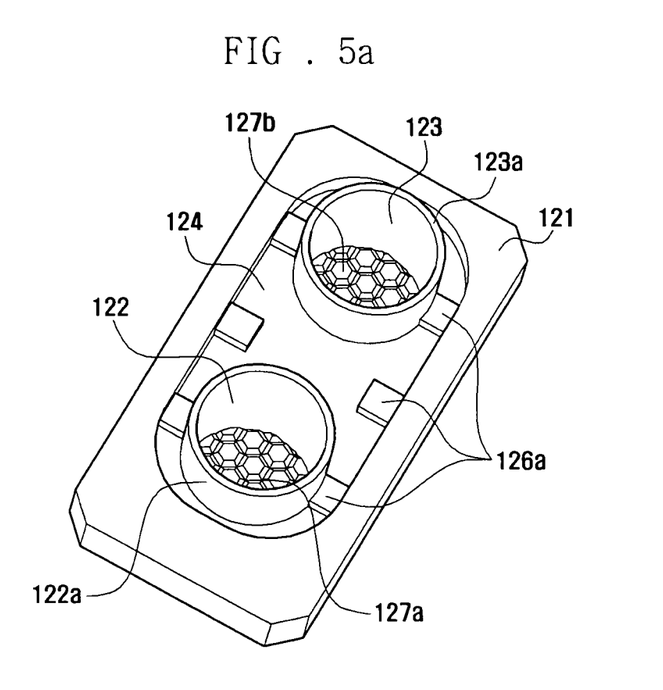
FIGS. 5A and 5B illustrate a reflecting film forming a lens unit of a sensing device using a proximity sensor according to an exemplary embodiment of the present invention.
Figure 5B:
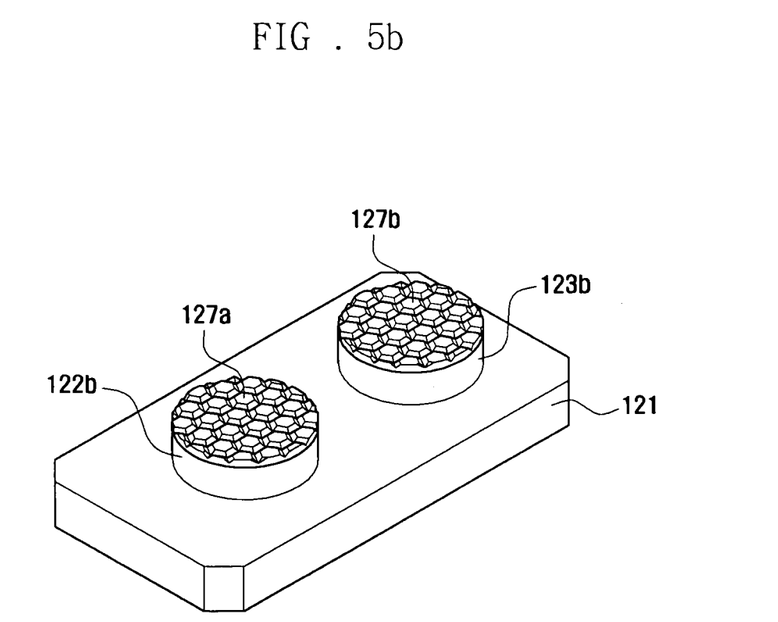

FIGS. 5A and 5B are perspective views illustrating a reflective film forming a lens unit of a sensing device using a proximity sensor according to an exemplary embodiment of the present invention.

The reflective film 125 surrounds the edges of the first and second through-openings 122 and 123, so that a first through-hole 125a and a second through-hole 125b are respectively formed close to the edges of the first and second through-openings 122 and 123.

As described above, since the lens body 121 of the lens unit 120 installed on the proximity sensor 110 is made of transparent materials, light, which is emitted from the light emitting unit 111 of the proximity sensor 110, can be diffused by the surface or inside of the transparent lens body 121 and can enter the light receiving unit 112 of the proximity sensor 110 before the arrival of the light to the external object. Therefore, in this case, the proximity sensor 110 erroneously senses approach of the external object, that is, malfunctions.

However, in the sensing device using the proximity sensor according to an exemplary embodiment of the present invention, the opaque reflective film 125 is provided in the transparent lens body 121 of the lens unit 120 that is installed on the proximity sensor 110. Therefore, the malfunction of the proximity sensor 110 is prevented and accurate sensing of the proximity sensor 110 for the approach of the external object may be increased. Since the light emitting unit 111 of the proximity sensor 110 emits light with maximum power, the sensing distance of the proximity sensor 110 can be increased and power consumption of the proximity sensor 110 can be decreased when an object approaches at the same distance from the proximity sensor.

In the sensing device 100 including the proximity sensor 110 according to an exemplary embodiment of the present invention, the lens body 121 and the reflective film 125 of the lens unit 120 may be integrally formed by double injection molding. That is, a transparent material such as glass or plastic can be injection-molded into the lens body 121 and an opaque material such as an opaque resin may be injection-molded into the groove 124 on the lens body 121 to form the reflective film 125. When the reflective film 125 is inserted into the lens body 121, the upper surface of the reflective film 125 can be aligned with the upper surface of the lens body 121.

Since double injection molding of two different materials is well known, detailed descriptions thereof will be omitted.

As illustrated in FIGS. 4A and 5B, the lens body 121 includes at least one protrusion 126a and the reflective film 125 includes at least one guide groove 126b such that the lens body 121 and the reflective film 125 can be easily integrated with each other during the double injection molding. FIGS. 4A and 5B illustrate three protrusions 126a formed on the upper side of the groove 124 of the lens body 121 and three guide grooves 126b formed in the bottom of the reflective film 125 to correspond to the three protrusions 126a of the lens body 121. The reflective film 125 can be seated in the groove 124 of the lens body 121 by the protrusions 126a and the guide grooves 126b. The configurations in FIGS. 4B and 5B are just an example and the present invention is not limited thereto and can be modified by those skilled in the art.

In the sensing device 100 including the proximity sensor 110 according to an exemplary embodiment of the present invention, the lens body 121 and the reflective film 125 of the lens unit 129 are integrated with each other by double injection molding so that the sensing device 100 using the proximity sensor 110 can be simplified and manufacturing costs can be reduced.

Meanwhile, a first through-opening cover 127a and a second through-opening cover 127b are installed on the top or the bottom of the first through-opening 122 and the second through-opening 123 respectively. As described above, in order to increase the transmittance of light emitted from the light emitting unit 111 of the proximity sensor 110 and light reflected from the external object and entering into the light receiving unit 112 of the proximity sensor 110, the first through-opening 122 and the second through-opening 123 can be transparent. However, when the first and second through-openings 122 and 123 are transparent, the inside of the mobile terminal 1 such as the proximity sensor 110 may be exposed to the outside. Therefore, the first and second through-opening covers 127a and 127b are installed on the top or the bottom of the first and second through-openings 122 and 123 to prevent the inside of the mobile terminal 1 from being exposed to the outside.

Figure 6A:
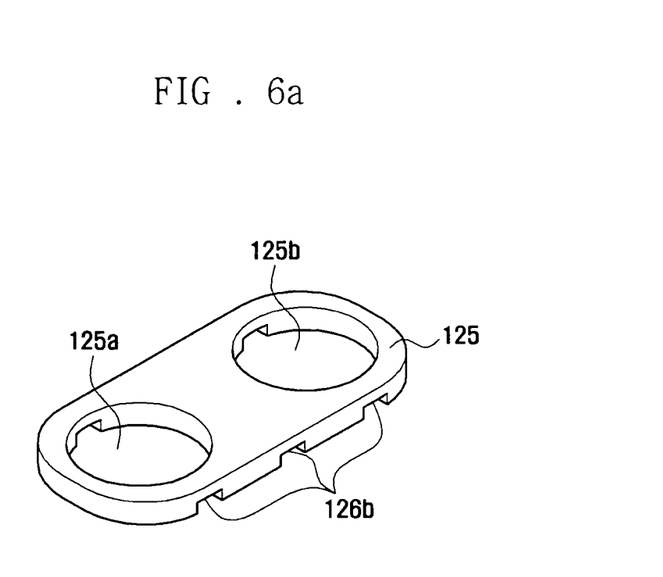
FIGS. 6A and 6B illustrate a first light-transmission opening and a second light-transmission opening of a lens unit of a sensing device using a proximity sensor according to an exemplary embodiment of the present invention.
Figure 6B:
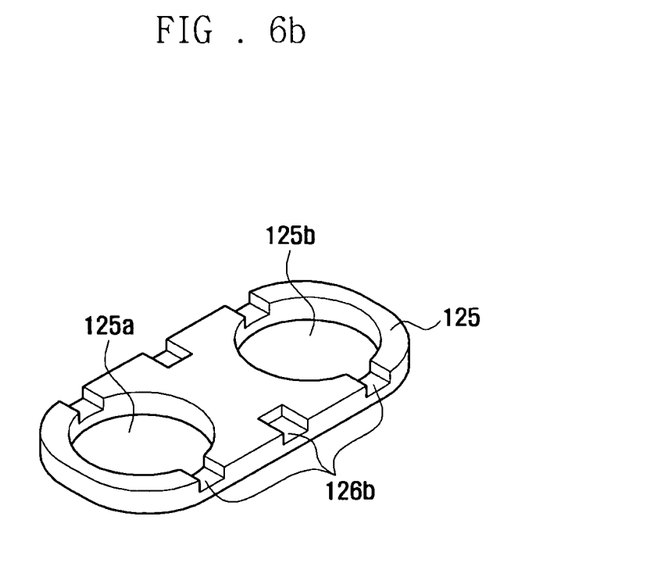

FIGS. 6A and 6B are perspective views illustrating a first through-opening and a second through-opening which are respectively covered with a first through-opening cover and a second through-opening cover in a lens unit of a sensing device using a proximity sensor according to an exemplary embodiment of the present invention.

FIGS. 6A and 6B show the first through-opening cover 127a and the second through-opening cover 127b installed on the bottoms of the first through-opening 122 and the second through-opening 123, more particularly on the tops of the first protrusion 122b and the second protrusion 123b. As illustrated in FIGS. 6A and 6B, the first and second through-opening covers 127a and 127b may have a honeycomb shape. The first and second through-opening covers 127a and 127b can be integrally formed with the first and second protrusions 122b and 123b by injection molding or can be separately manufactured to be attached to the first protrusion 122b and the second protrusion 123b, respectively.

When the first and second through-opening covers 127a and 127b are installed to the first and second through-openings 122 and 123, the transmittance of light, for example, Infrared (IR) light, emitted from the light emitting unit 111 of the proximity sensor 110 and light reflected from the external object and entering into the light receiving unit 112 of the proximity sensor 110 can be decreased. Although not illustrated in the drawings, a luminance sensor can be installed in the sensing device 100 to sense the quantity of incident light from the outside and to control the luminance of the display unit 11 to conserve power of the mobile terminal 1. To detect the quantity of light entering into the luminance sensor, the transmittance of the first and second through-opening covers 127a and 127b respectively installed in the first through-opening 122 and the second through-opening 123 has to be adjusted properly.

The transparency of the first through-opening cover 127a and the second through-opening cover 127b installed in the first through-opening 122 and the second through-opening 123 can be determined in consideration of the transmittance of light emitted from the light emitting unit 111 of the proximity sensor 110 and light reflected from the external object and entering into the light receiving unit 112 of the proximity sensor 110, the transmittance of light used at the luminance sensor, and how much the inside of the mobile terminal 1 is exposed to the outside.

As described above, according to the sensing device including the proximity sensor 110 of the present invention, since the first and second through-opening covers 127a and 127b are installed on the tops or the bottoms of the first and second through-openings 122 and 123 respectively, it is possible to prevent the inside of the mobile terminal 1 from being exposed to the outside.

Moreover, since the first and second through-opening covers 127b and 127b enable the first and second through-openings 123 to be made of transparent materials, sensing accuracy of the luminance sensor may be increased.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A sensing device comprising:
a proximity sensor configured to sense an approach of an external object; and
a lens unit disposed proximate to a top of the proximity sensor, the lens unit comprising:
a lens body comprising a first through-opening through which light emitted from a light emitting unit of the proximity sensor passes and a second through-opening through which light, reflected from the external object and entering into a light receiving unit of the proximity sensor, passes; and
a reflective film formed in the lens body configured to surround edges of the first through-opening and the second through-opening,
wherein the reflective film is made of opaque materials.

2. The sensing device of claim 1, wherein the lens body and the reflective film are integrated with each other by double injection molding.

3. The sensing device of claim 1, wherein the lens unit further comprises a first protrusion and a second protrusion extending upward and downward from the edges of the first through-opening and the second through-opening.

4. The sensing device of claim 1, further comprising a first through-opening cover and a second through-opening cover disposed on the top or the bottom of the first through-opening and the second through-opening in a honeycomb shape.

5. The sensing device of claim 1, wherein the lens body and the reflective film comprise at least one protrusion and at least a guide groove so that the lens body and the reflective film can be coupled with each other by the double injection molding.

6. The sensing device of claim 1, wherein the proximity sensor further comprises a light shielding film installed between the light emitting unit and the light receiving unit, the light shielding film configured to prevent the light emitted from the light emitting unit from entering into the light receiving unit.

7. The sensing device of claim 6, wherein light shielding film is formed of opaque materials.

8. A mobile terminal comprising:
a sensing device, disposed adjacent to a display unit provided in a front side of the mobile terminal and configured to control an operation of the display unit according to whether an external object approaches the display unit, the sensing device comprising:
a proximity sensor configured to sense an approach of the external object using light reflected from the external device; and
a lens unit disposed at a top of the proximity sensor comprising a lens body made of opaque materials and comprising a first through-opening through which light emitted from a light emitting unit of the proximity sensor passes and a second through-opening through which light reflected from the external object and entering into a light receiving unit of the proximity sensor passes.

9. The mobile terminal of claim 8, wherein the lens unit is formed in the lens body to surround edges of the first through-opening and the second through-opening.

10. The mobile terminal of claim 8, wherein the lens body and the reflective film are integrated with each other by double injection molding.

11. The mobile terminal of claim 8, wherein the sensing device further comprises the first through-opening cover and the second through-opening cover installed on the top or the bottom of the first through-opening and the second through-opening.

12. The mobile terminal of claim 8, wherein the sensing device is disposed adjacent to a receiver provided at the upper side of the mobile terminal.

13. The mobile terminal of claim 8, wherein the proximity sensor further comprises a light shielding film installed between the light emitting unit and the light receiving unit, the light shielding film configured to prevent the light emitted from the light emitting unit from entering into the light receiving unit.

14. A method for a mobile terminal, the method comprising:
sensing, with a proximity sensor, an approach of an external object;
passing light through a first through-opening in a lens body, the light emitted from a light emitting unit of the proximity sensor; and
reflecting light through a second through-opening in the lens body, the reflected light reflected from the external object and entering into a light receiving unit of the proximity sensor, a reflective film formed in the lens body and configured to surround edges of the first through-opening and the second through-opening, the reflective film made of opaque materials.

15. The method of claim 14, wherein the lens body and the reflective film are integrated with each other by double injection molding.

16. The method of claim 14, wherein the lens unit comprises a first protrusion and a second protrusion extended upward and downward from the edges of the first through-opening and the second through-opening.

17. The method of claim 14, further comprising a first through-opening cover and a second through-opening cover disposed proximate to one of: the top and the bottom of the first through-opening and the second through-opening in a honeycomb shape.

18. The method of claim 14, wherein the lens body and the reflective film comprise at least one protrusion and at least one guide groove so that the lens body and the reflective film is coupled with each other by the double injection molding.

19. The method of claim 14, wherein the proximity sensor further comprises a light shielding film installed between the light emitting unit and the light receiving unit to prevent the light emitted from the light emitting unit from entering into the light receiving unit.

20. The method of claim 14, further comprising forming the light shielding film using opaque materials.

* * * * *